United States Patent [19]
Pankove et al.

[11] Patent Number: 5,136,353
[45] Date of Patent: Aug. 4, 1992

[54] OPTICAL SWITCH

[75] Inventors: Jacques I. Pankove; Christian V. Radehaus, both of Boulder, Colo.

[73] Assignee: The University of Colorado Foundation, Inc., Boulder, Colo.

[21] Appl. No.: 521,781

[22] Filed: May 10, 1990

[51] Int. Cl.⁵ .................. H01L 29/74; H01L 29/161; H01L 29/205; H01L 33/00
[52] U.S. Cl. ........................ 357/38; 357/16; 357/17; 357/30
[58] Field of Search .............. 357/17, 30, 19, 16, 357/38

[56] References Cited

U.S. PATENT DOCUMENTS

| 4,152,713 | 5/1979 | Copeland, III et al. | |
|---|---|---|---|
| 4,163,241 | 7/1979 | Hutson . | |
| 4,717,947 | 1/1988 | Matsuda et al. | 357/38 |
| 4,757,367 | 7/1988 | Konishi et al. | 357/38 |
| 4,829,357 | 5/1989 | Kasahara | 357/38 |
| 4,841,350 | 6/1989 | Nishizawa | 357/38 |
| 4,910,571 | 3/1990 | Kasahara et al. | 357/30 |
| 4,931,656 | 6/1990 | Ehalt et al. | 357/19 |
| 4,977,433 | 12/1990 | Pankove | 357/17 |

FOREIGN PATENT DOCUMENTS 55-93262  7/1980  Japan .

*Primary Examiner*—Andrew J. James
*Assistant Examiner*—Carl Whitehead, Jr.
*Attorney, Agent, or Firm*—Donald S. Cohen; Earl C. Hancock

[57] ABSTRACT

The present invention relates to an optical switch which will generate and emit a beam of light when an optical signal is directed therein, but includes means to inhibit the generation of the beam of light when a second optical signal is directed therein. The switch includes a light emitter formed of a plurality of layers of alternating opposite conductivity type which is adapted to generate the beam of light when an optical signal is directed therein. A photovoltaic inhibitor is connected to the emitter so that any current generated by the inhibitor is applied across the emitter in a manner to prevent the generation of the light in the emitter. The photovoltaic inhibitor generates the current when a second optical signal is directed therein. Depending on the external circuit, the device can be operated in either a digital (bistable) or analog mode.

17 Claims, 3 Drawing Sheets

OPTICAL SWITCH

FIELD OF THE INVENTION

The present invention relates to an optical switch, and, more particular, to an optical switch which has two optical inputs, one to turn the switch on and the other to inhibit the switch from being turned on.

BACKGROUND OF THE INVENTION

In optical communication systems, optical switches are used to control the flow of optical signals. One such optical switch is described in U.S. Pat. No. 4,152,713 to John A. Copeland, III et al, issued May 1, 1979, entitled UNIDIRECTIONAL OPTICAL DEVICE AND REGENERATOR. This device includes a body of a semiconductor material having four layers of alternating opposite conductivity type, i.e PNPN or NPNP, forming PN junctions between adjacent layers. Preferably, the inner two layers are made of a direct-gap semiconductor material, and the outer two layers are made of a wider-band-gap material so as to form a heterojunction between the outer two layers and each of the inner two layers. These heterojunctions act to confine electrons in the inner two layers where they are converted to photons. The photons are emitted from the device as a beam of light. The device is operated by applying a voltage across the device which is lower than the threshold voltage necessary in the dark to turn on the device and generate light. A beam of light is directed into the device which lowers the threshold voltage and thereby causes light to be generated in the device. The light is then emitted from the device as a beam. Although the device is turned on by directing a beam of light therein, it can only be turned off by removing the electrical input. Thus, to operate the device for optical communication purposes, the electrical input must be pulsed.

Another type of optical switch which can be turned both on and off by an optical signal is described in the application for U.S. Pat. Ser. No. 07/428,388, filed Oct. 27, 1989 by Jacques I. Pankove, entitled OPTOELECTRONIC SEMICONDUCTOR DEVICE. The device of this application includes a switch of a body of semiconductor material having four layers of alternating conductivity type, i.e. PNPN or NPNP, forming PN junctions between adjacent layers. Preferably, the inner two layers are made of direct-gap semiconductor material and the outer two layers are made of a wider-band-gap material so as to form heterojunctions between the outer two layers and each of the inner two layers. A first optically variable resistance device, such as a photoconductor, is connected in series with the switch and one side of a source of current, and a second optically variable resistance device, such as a photodetector, is connected in series with the switch and the other side of the current source. The switch is capable of emitting light when a voltage above a threshold is applied thereto. By directing a light into the first optically variable resistance device, the voltage applied across the switch is increased to a level just below the threshold and is raised to at least the threshold by directing a light into the switch so as to turn on the switch. The switch is turned off by directing a beam of light into the second optically variable resistance device which reduces the voltage applied across the switch below a holding voltage.

Thus, there are optical switches which can be turned on optically and off electrically and switches which can be turned both on and off optically. However, there are optical communication systems which require a switch which can be turned on by an optical input but which can be prevented from being turned on by a second optical input. Although the switch of the above application Ser. No. 07/428,388 has a provision for turning off, and therefore inhibiting the turn-on of the device, in the present invention the inherent amplification property of part of the device is utilized to greatly increase its sensitivity to the inhibit signal.

SUMMARY OF THE INVENTION

The present invention relates to an optical switch comprising a body of a semiconductor material having a plurality of layers of alternating opposite conductivity types forming PN junction between the layers. The body being capable of generating light by the recombination of oppositely charged carriers. Means is connected across one of said PN junctions to inhibit the flow of charge carriers across the junction when a beam of light is directed at the means. Thus, a light input directed solely at the switch will cause the switch to turn on and emit a beam of light. However, when a second beam of light is directed as the inhibit means the switch will be prevented from being turned on when a light input is directed thereat so no light will be emitted from the switch.

DETAILED DESCRIPTION OF PREFERRED EMBODIMENTS

Figure 1:
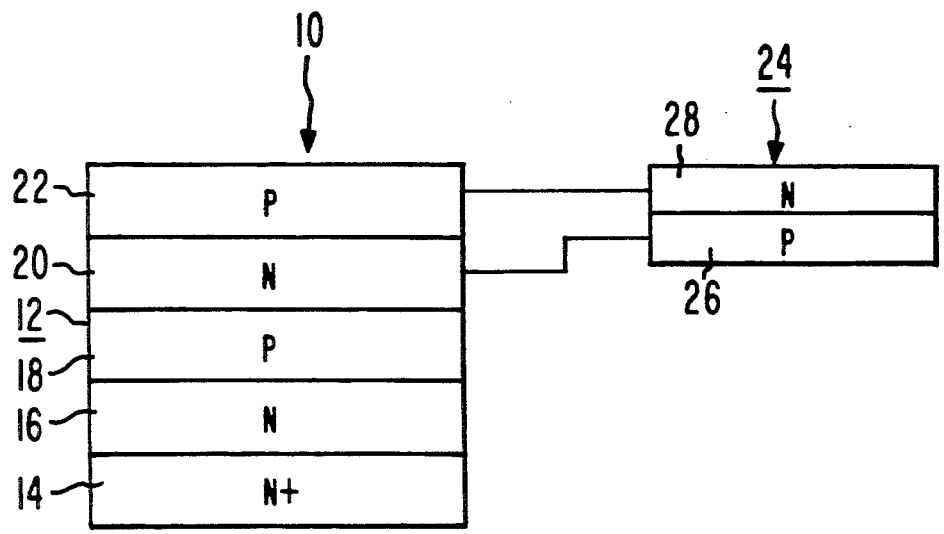
FIG. 1 is a schematic view of one form of the optical switch of the present invention.

Referring to FIG. 1, one form of the switch of the present invention is generally designated as 10. Switch 10 comprises a body 12 similar to that shown in U.S. Pat. No. 4,152,713 in that it comprises a substrate 14 having thereon four layers 16, 18, 20 and 22 of alternating opposite conductivity types, such as NPNP, forming PN junctions between adjacent layers. The substrate 14 is of the same conductivity type as the first layer 16 but of higher conductivity. Thus, if the first layer 16 is of N-type conductivity, the substrate 14 is of N+type conductivity. Preferably, the outer two layers 16 and 22 are of a wider energy band-gap material, such as aluminum gallium arsenide (AlGaAs) and the two inner layers 18 and 20 are of a narrower energy band-gap material such as gallium arsenide (GaAs). Thus, the two inner layers 18 and 20 form a homojunction with each other, and each of the outer layers 16 and 22 forms a heterojunction with its adjacent inner region 18 and 20 respectively.

A photovoltaic inhibitor 24 is connected to the layers 20 and 22 in a manner so as to inhibit the flow of charge carriers across the PN junction between the layers 20 and 22. The photovoltaic inhibitor 24 is a photodetector formed of two layers 26 and 28 of opposite conductivity type and of a semiconductor material which will generate an electrical current when light is directed at the photodetector 24. The semiconductor material can be single crystalline silicon, hydrogenated amorphous silicon or one of the group III–V semiconductor materials. In order to inhibit the flow of charge carriers across the PN junction between the layer 20, which is of N-type conductivity, and the layer 22, which is of P-type conductivity, the layer 26 of the inhibitor 24, which is connected to the layer 20, is of P-type conductivity, and the layer 28, which is connected to the layer 22, is of N-type conductivity.

In the operation of the switch 10, a voltage is applied across the body 12 in a direction so as to reverse bias the PN junction between the two inner layers 18 and 20 and to forward bias each of the PN heterojunction between the outer layers 16 and 22 and each of its adjacent inner layer 18 and 20. If the applied voltage is increased high enough, breakdown will result from either avalanching (when a critical field is exceeded at the reverse-biased junction), or from punch-through (when a depletion layer extends to the nearest forward-biased heterojunction). During such a breakdown, double injection occurs, which floods the two inner regions 18 and 20 with electrons and holes that are stopped by the potential barriers at the heterojunctions between each of the inner regions 18 and 20 and its adjacent outer region 16 and 22. This results in the generation of light in the body 12 which is emitted either from an end surface of the body 12 or from an edge of the body 12.

In the switch 10, the voltage applied across the body 12 is at a level just below that which will cause breakdown. Light is then directed into the body 12. The photons from the light are absorbed in the inner regions 18 and 20 inducing breakdown. The presence of a high electric field in the junction lowers the photon energy to which the device is sensitive, the Franz-Keldysh effect. Essentially the absorbed photons produce electron-hole pairs that are separated by the electric field. These charges accumulate on either side of the PN junction, lowering the potential barrier to he injection of carriers from the outer regions 16 and 22. This results in double-injection and light is generated in the body 18 by the recombination of the injected charge carriers. Thus, a beam of light directed into the body 12 will cause the generation of light in the switch 12. However, if a beam of light is directed into the photovoltaic inhibitor 24, a current is generated in the inhibitor 24 which is directed across the PN junction between the layers 20 and 22 of the body 12 so as to reverse bias the heterojunction. This reverse biasing of the heterojuncton between the layers 20 and 22 prevents the flow of charge carriers across the junction when a beam of light is also directed into the body 12. Thus, the light directed into the photovoltaic inhibitor 24 prevents the generation of light in the body 12. Therefore, in the switch 10 of the present invention, a beam of light directed only into the body 12 will cause the generation of light, whereas a beam of light directed into the photovoltaic inhibitor will prevent the generation of light in the body 12 even when a beam of light is also directed into the body 12.

Figure 2:
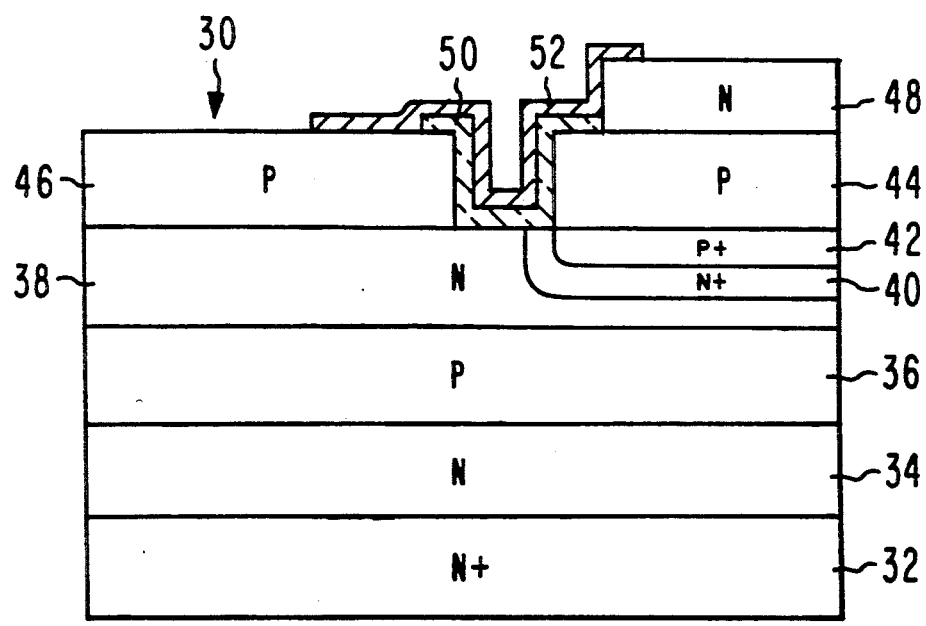
FIG. 2 is a sectional view of a completely monolithic form of the switch of the present invention.

Referring to FIG. 2, there is shown an monolithic form 30 of the switch of the present invention. The switch 30 comprises a substrate 32 of N+type conductivity gallium arsenide having on a surface thereof a layer 34 of N-type conductivity aluminum gallium arsenide. On the layer 34 is a layer 36 of P-type conductivity gallium arsenide and on the layer 36 is a layer 38 of N-type conductivity gallium arsenide. In a portion of the layer 38 is a region 40 of N+type conductivity and in the region 40 is a slightly smaller region 42 of P+type conductivity. On the layer 38 and only over the P+type region 42 is a layer 44 of P-type conductivity aluminum gallium arsenide or gallium arsenide. Also on the layer 38 and spaced from the N+type region 40 is a layer 46 of P-type conductivity aluminum gallium arsenide or gallium arsenide. The P-type layer 46 is spaced from the P-type layer 44. On a portion of the layer 44 is a layer 48 of N-type conductivity aluminum gallium arsenide. A layer 50 of an insulating material, such as silicon dioxide, is on the surface of the N-type layer 38 between the P-type layers 44 and 46. The insulating layer 50 also extends along the adjacent edges of the P-type layers 44 and 46 and over a portion of their surfaces. A layer 52 of a conductive material, such as a metal, extends over the N-type layer 48, the insulating layer 50 and the P-type layer 46.

In the switch 30, the layers 34, 36, 38 and 46 serve as the switch which generates and emits light when a beam of light is directed therein. The layers 44 and 48 form the photovoltaic inhibitor with the P-type layer 44 being electrically connected to the N-type layer 38 of the switch through the regions 42 and 40, and the N-type layer 48 being connected to the P-type layer 46 of the switch through the metal layer 52. The highly conductive regions 40 and 42 serve as contacts for the layers 38 and 44 respectively and prevent the formation of a blocking junction between the two layers of opposite conductivity type. The switch 30 operates in the same manner as previously described.

Figure 3:
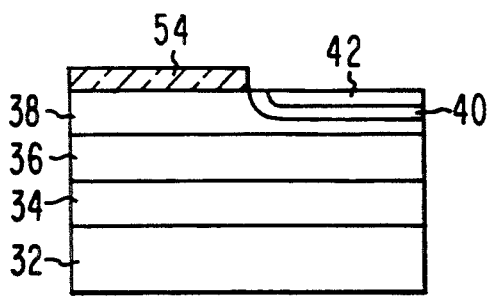
FIGS. 3–6 are sectional views illustrating a method of making the switch shown in FIG. 2;
switch shown in FIG. 2.

Referring to FIGS. 3–6, there is illustrated the steps of one method of making the switch 30. As shown in FIG. 3, the N-type layer 34, P-type layer 36 and N-type layer 38 are deposited in succession on the substrate 32. This may be done by any of the well known epitaxial deposition techniques for the particular materials used, such as by liquid phase or vapor phase epitaxy. A masking layer 54, such as of silicon dioxide, is deposited on the N-type layer 38, and, using standard photolithographic techniques and etching, is defined to extend over only a portion of the layer 38. Ions of a N-type conductivity modifier for the particular material of the layer 38 are then embedded into the exposed surface of the layer 38, such as by ion implantation or diffusion, to form the N+type region 40. Similarly ions of a P-type conductivity modifier are then embedded into the region 40 to form the region 42.

Figure 4:
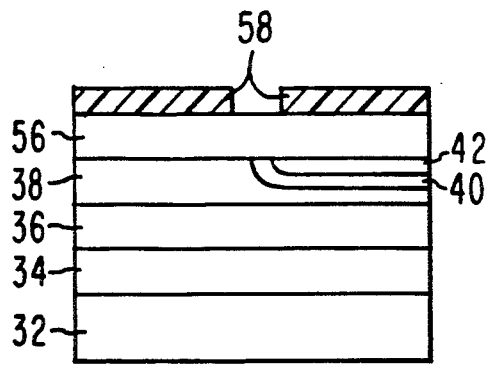
Figure 5:
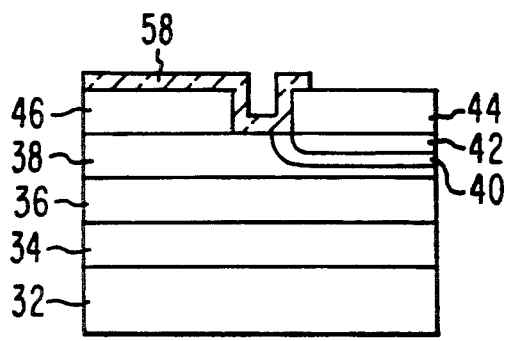

The mask 54 is removed and a layer 56 of P-type conductivity aluminum gallium arsenide is then deposited over the layer 38 as shown in FIG. 4. A masking layer 58 is deposited on the layer 56, and, using standard photolithographic techniques, is defined to provide an opening therein over the portion of the region 40 which extends to the surface of the layer 38 and adjacent portions of the region 42 and the layer 38. As shown in FIG. 5, the exposed portion of the layer 56 is removed, such as with a suitable etching technique, down to the layer 38 so as to form the spaced P-type layers 44 and 46.

Figure 6:
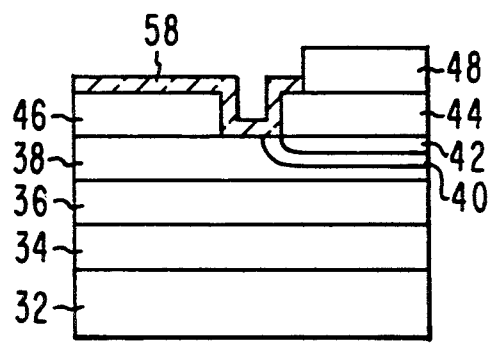

A layer 58 of silicon dioxide is then deposited over the layers 44 and 46 and the surface of the layer 38 between the layers 44 and 46. The silicon dioxide layer 58 is defined, using standard photolithographic techniques, to expose a portion of the layer 44. As shown in FIG. 6, the N-type aluminum gallium arsenide layer 48 is then deposited on the P-type layer 44 using a well known epitaxial deposition technique. A portion of the silicon dioxide layer 58 is then removed from over the P-type layer 46 to form the insulating layer 50 of FIG. 2, and the metal layer 52 is deposited over the N-type layer 48, insulating layer 50 and P-type layer 46.

Figure 7:
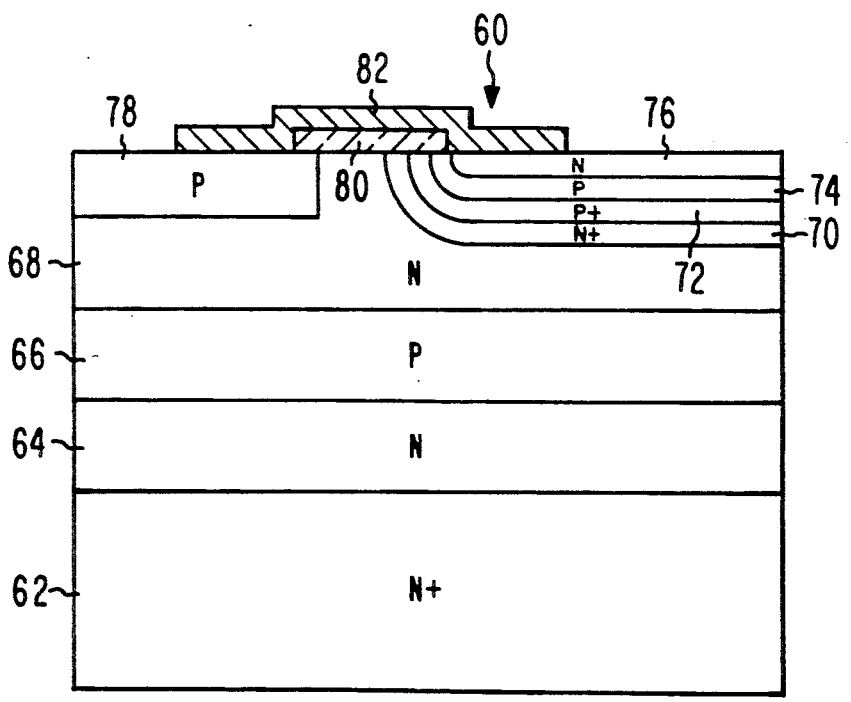
FIG. 7 is a sectional view of another form of a completely monolithic form of the switch of the present invention.

Referring to FIG. 7, there is shown another monolithic form 60 of the switch of the present invention. The switch 60 comprises a substrate 62 of N+type gallium arsenide having a layer 64 of N-type aluminum gallium arsenide on a surface thereof. A layer 66 of P-type gallium arsenide is on the layer 64, and a layer 68 of N-type gallium arsenide is on the layer 66. In a portion of the N-type layer 68 is a region 70 of N+type conductivity. In a portion of the N+type region 70 is a region 72 of P+type conductivity. In a portion of the P+type region 72 is a region 74 of P-type conductivity, and in a portion of the P-type region 74 is a region 76 of N-type conductivity. In the N-type layer 68 spaced from the N+type region 70 is a layer 78 of P-type conductivity aluminum gallium arsenide. An insulating layer 80 of silicon dioxide, is on the surface of the N-type layer 68 between the P-type layer 78 and the N-type region 76. A conductive layer 82, such as of a metal, extends over the insulating layer 80 and contacts the N-type region 76 and the P-type layer 78.

Thus, in the switch 60, the layers 64, 66, 68 and 78 form the switch which will generate and emit light when a beam of light is directed therein. The N-type region 76 is electrically connected to the P-type layer 78 through the metal layer 82, and the P-type region 74 is electrically connected to the N-type layer 68 through the regions 70 and 72. Thus, when a beam of light is directed into the regions 74 and 76 they form the photovoltaic inhibitor which reverse biases the junction between the layers 68 and 78 to inhibit the generation of light in the switch even when a beam of light is directed into the switch.

The switch 60 may be made by depositing onto the surface of the substrate 62 in succession the N-type layer 64, the P-type layer 66 and the N-type layer 68. A mask is formed over a portion of the surface of the N-type layer 68 and the regions 70 and 72 are then formed in succession by embedding the appropriate conductivity modifiers into the layer 68, such as by ion implantation or diffusion. A portion of the layer 68 in the region 72 is then removed to form a notch, and the regions 74 and 76 are deposited in succession in the notch. An etch resistant mask is then formed over the surface of the layer 68 and provided with an opening over the portion of the layer 68 where the P-type layer 78 is to be formed. The exposed portion of the N-type layer 68 is then etched to form a groove therein and the P-type layer 78 is then deposited on the N-type layer 68 within the opening. The insulating layer 80 is then formed on the N-type layer 68 and P-type layer 78 and the conductive layer 82 is then coated over the N-type region 76, insulating layer 80 and P-type layer 78.

Alternatively, after the N-type layer 64 and P-type layer 66 are deposited on the substrate 62, a layer of N-type gallium arsenide may then be deposited on the P-type layer 66. A p-type aluminum gallium arsenide layer may then be deposited on the N-type gallium arsenide layer. A portion of the P-type aluminum gallium arsenide is then removed with a suitable etchant to form the P-type layer 78. N-type gallium arsenide may then be deposited on the exposed surface of the N-type layer to form the N-type layer 68. The various regions 70, 72, 74 and 76 would then be formed in the N-type layer 68 in the manner described above.

Figure 8:
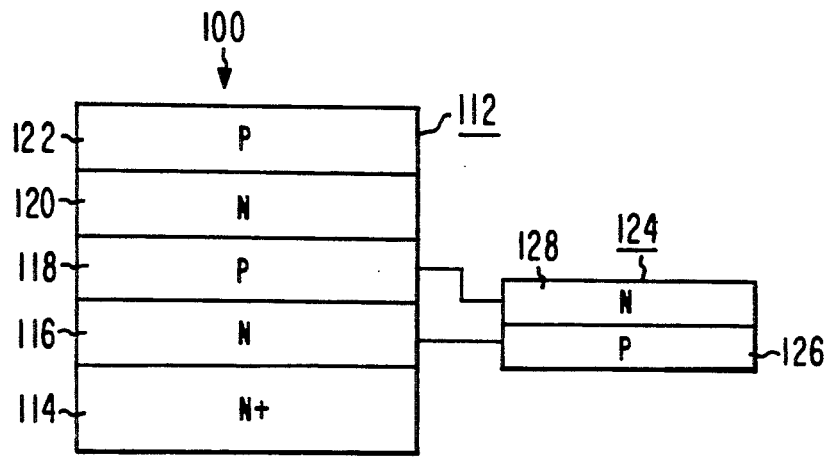
FIG. 8 is a schematic view of another form of the switch of the present invention.

Although the optical switch of the present invention has been described as having the photovoltaic inhibitor connected between the two outer layers of the switch, the inhibitor can be connected between the two inner layers. FIG. 8 shows a switch 100 with the inhibitor 124 connected to the two inner layers 116 and 118 of the switch body 112. For this form of the switch, the P-type layer 126 of the inhibitor 124 is connected to the N-type layer 116 of the body 112, and the N-type layer 128 of the inhibitor 124 is connected to the P-type layer 118 of the body 112. Thus, the current generated in the inhibitor 112 when light is directed thereon will reverse bias the heterojunction between the layers 116 and 118 of the body 112 to prevent the switch from generating and emitting light when light is directed into the body 112.

Figure 9:
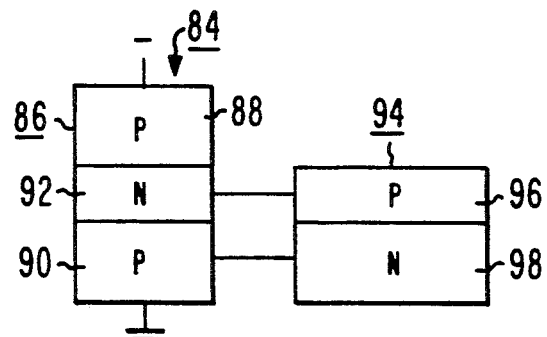
FIGS. 9–12 are schematic views of other forms of a switch utilizing the inhibition principal of the present invention.

Although the optical switch of the present invention has been described as including a four layer light emitter, as shown in FIGS. 9-12, it can use a three layer emitter in which the layers are of PNP or NPN conductivity. FIG. 9 shows a switch 84 of the present invention in which the light emitter 86 has two outer P-type layers 88 and 90 with a N-type layer 92 therebetween. The emitter 86 is connected across a source of current with the outer layer 88 being connected to the negative side of the current source and the outer layer 90 being grounded. The photovoltaic inhibitor 94 has its P-type layer 96 connected to the middle N-type layer 92, and its N-type layer 98 connected to the grounded P-type layer 90. Thus, when light is directed on the inhibitor 94, the current generated by the inhibitor 94 reverse biases the junction between the two layers 90 and 92 to prevent the emitter 86 from generating and emitting light when a beam of light is directed thereon.

Figure 10:
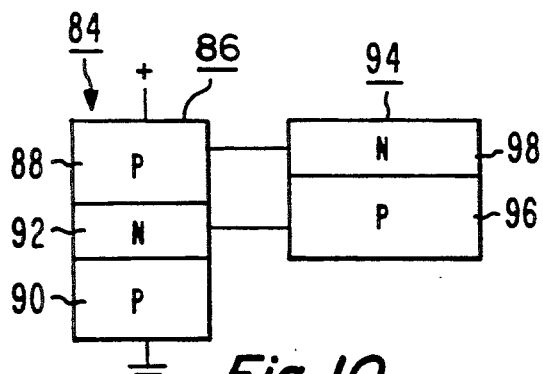

FIG. 10 shows the optical switch 84 with the outer layers 88 and 90 being connected between the positive side of the current source and ground. For this arrangement, the N-type layer 98 of the inhibitor 94 is connected to the outer layer 88 of the emitter 86, which is connected to the positive side of the current source, and the P-type layer 96 of the inhibitor 94 is connected to the N-type layer 92 of the emitter 86. Thus, when a light beam is directed at the inhibitor 94, the current generated thereby is applied across the emitter 86 so as to reverse bias the junction between the layers 88 and 92 of the emitter 86 so as to prevent the emitter 86 from generating and emitting light when a beam of light is directed therein.

Figure 11:
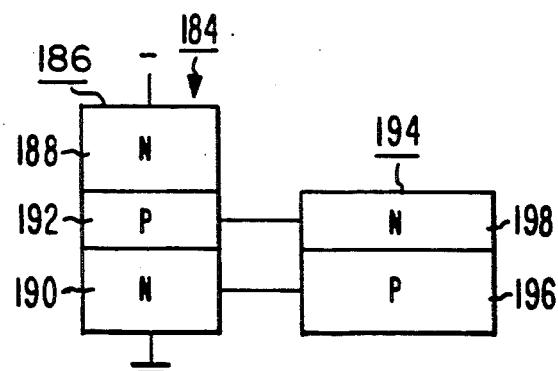
Figure 12:
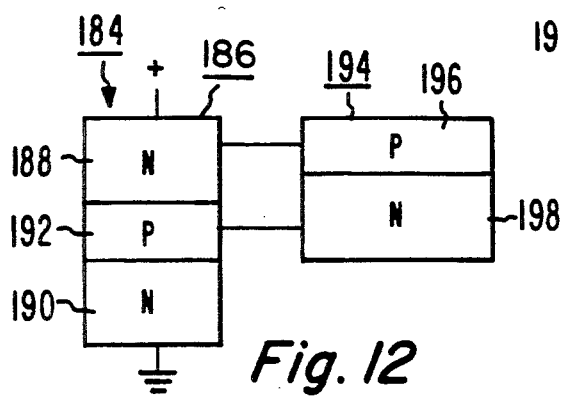

FIGS. 11 and 12 show optical switches 184 in which the outer two layers 188 and 190 of the emitter 186 are of N-type conductivity and the inner layer 192 is of P-type conductivity. In FIG. 11 the switch 184 is connected between the negative side of the current source and ground, and in FIG. 12 the switch 184 is connected between the positive side of the current source and ground. In the switches 184 shown in FIGS. 11 and 12, the N-type layer 198 of the inhibitor 194 is connected to the middle P-type layer 192 of the emitter 186. However, in the switch 184 shown in FIG. 11, the P-type layer 196 of the inhibitor 194 is connected to the grounded N-type layer 190 of the emitter 186 whereas in the switch 184 shown in FIG. 12, the P-type layer 196 of the inhibitor 194 is connected to the N-type layer 188 of the emitter 184 which is connected to the positive side of the current source. In each of the switches 184, the inhibitor 194 serves to reverse bias one of the junctions of the emitter 186 to prevent the switch from turning on.

Thus there is provided by the present invention an optical switch which includes a light emitter which generates and emits a beam of light when an optical signal is directed therein, and a photovoltaic inhibitor connected to the emitter so as to prevent the emitter from emitting light when an optical signal is directed into the inhibitor. Although the emitter has been described as being formed of aluminum gallium arsenide for the outer two layers and gallium arsenide for the inner two layers, it can be made of any known semiconductor material having the desired properties. For example, both the inner and outer layers can be made of aluminum gallium arsenide with the inner layers having a smaller content of aluminum. Alternatively, the substrate and the outer layers may be formed of indium phosphide and the inner layers of indium gallium arsenide. Also, each of the outer layers of the device to which a contact is made may be provided with a high conductivity capping layer of the same material and conductivity type as the outer layer to provide better electrical contact to the outer layer. Depending on the external circuit, the device can be operated in either a digital (bistable) or analog mode.

What is claimed is:

1. An optical switch comprising:
   a body of a semiconductor material having a plurality of layers of alternating opposite conductivity type forming PN junction therebetween, said body being capable of generating light by the recombination of oppositely charged carriers which are formed in said layers and flow across said junctions when a first beam of light is directed into the body; and
   means connected in parallel across one of said junctions to inhibit the flow of charge carriers across said junction when a second beam of light separate from the first beam which is directed into the body is directed into said means.

2. An optical switch in accordance with claim 1 in which said inhibiting means comprises a photovoltaic device.

3. An optical switch in accordance with claim 2 in which the photovoltaic device includes a pair of regions of opposite conductivity type with the regions being connected to two of the layers of the body so that a current generated in the photovoltaic device reverse biases the junction between the two layers of the body.

4. An optical switch in accordance with claim 3 in which the body includes four layers of alternating opposite conductivity type.

5. An optical switch in accordance with claim 3 in which the body includes three layers of alternating opposite conductivity type.

6. An optical switch comprising:
   a substrate of a semiconductor material;
   a first layer of a semiconductor material of one conductivity type on a surface of the substrate;
   a second layer of a semiconductor material of the opposite conductivity type on the first layer;
   a third layer of a semiconductor material of the one conductivity type on the second layer;
   a first region of the one conductivity type but of higher conductivity than the third layer in a portion of the third layer;
   a second region of the opposite conductivity type in a portion of the first region;
   a fourth layer of a semiconductor material of the opposite conductivity type on the other portion of the third layer and spaced from the first region;
   a photovoltaic semiconductor device on the second region, said photovoltaic device having one side connected to the third layer through the two regions; and
   means connecting the other side of the photovoltaic device to the fourth layer so as to connect the photovoltaic device in parallel with the junction between the fourth layer and the third layer.

7. An optical switch in accordance with claim 6 in which the photovoltaic device comprises a layer of a semiconductor material of the opposite conductivity type on the second region, said second region being of a conductivity higher than that of the layer thereon and a layer of a semiconductor material of the one conductivity type on the layer of the opposite conductivity type.

8. An optical switch in accordance with claim 7 including a layer of a conductive material extending between the layer of the one conductivity type of the photovoltaic device and the fourth layer to electrically connect the two layers.

9. An optical switch in accordance with claim 8 in which the fourth layer and the layers of the photovoltaic device are spaced apart on the third layer, a layer of an insulating material is over the surface of the third layer between said spaced layers, and the conductive layer extends over the insulating layer.

10. An optical switch in accordance with claim 9 in which the one conductivity type is N-type and the opposite conductivity type is P-type.

11. An optical switch in accordance with claim 10 in which the first and fourth layers are of a wide band-gap material and the two inner layers are of a narrower band-gap material.

12. An optical switch in accordance with claim 6 in which the photovoltaic device comprises a third region of the one conductivity type in a portion of the second region and a fourth region of the opposite conductivity type in a portion of the third region.

13. An optical switch in accordance with claim 12 in which the fourth layer is within a portion of the third layer.

14. An optical switch in accordance with claim 13 including a layer of a conductive material extending between the fourth region and the fourth layer.

15. An optical switch in accordance with claim 14 including a layer of an insulating material over the portion of the third layer between the fourth region and the fourth layer and the conductive layer extends over the insulating layer.

16. An optical switch in accordance with claim 13 in which the one conductivity type is N-type and the opposite conductivity type is P-type.

17. An optical switch in accordance with claim 16 in which the first and fourth layers are of a wider band-gap material and the second and third layers are of a narrower band-gap material.

* * * * *